US012562355B2

(12) United States Patent
Dhanakshirur et al.

(10) Patent No.: US 12,562,355 B2
(45) Date of Patent: Feb. 24, 2026

(54) ISOLATOR FOR PROCESSING CHAMBERS

(71) Applicant: Applied Materials, Inc., Santa Clara, CA (US)

(72) Inventors: Akshay Dhanakshirur, Hubli (IN); Saketh Pemmasani, Hyderabad (IN); Mayur Govind Kulkarni, Bangalore (IN); Madhu Santosh Kumar Mutyala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 502 days.

(21) Appl. No.: 17/228,996

(22) Filed: Apr. 13, 2021

(65) Prior Publication Data

US 2022/0328293 A1 Oct. 13, 2022

(51) Int. Cl.
*H01J 37/32* (2006.01)
*C23C 16/44* (2006.01)
(Continued)

(52) U.S. Cl.
CPC .... *H01J 37/32834* (2013.01); *C23C 16/4401* (2013.01); *C23C 16/45565* (2013.01); (Continued)

(58) Field of Classification Search
CPC ............. H01J 37/32834; H01J 37/3244; H01J 2237/3321; C23C 16/4401; C23C 16/45565; C23C 16/4583; C23C 16/505
(Continued)

(56) References Cited

U.S. PATENT DOCUMENTS 5,919,332 A * 7/1999 Koshiishi .......... H01J 37/32082
156/345.47
5,997,649 A 12/1999 Hillman
(Continued)

FOREIGN PATENT DOCUMENTS

CN 105714269 A 6/2016
JP H 9-55374 A 2/1997
(Continued)

OTHER PUBLICATIONS

International Search Report and Written Opinion dated Jul. 4, 2022 for Application No. PCT/US2022/021844.
(Continued)

*Primary Examiner* — Rudy Zervigon
(74) *Attorney, Agent, or Firm* — Patterson + Sheridan, LLP

(57) ABSTRACT

Apparatus and methods for reducing undesirable residue material deposition and buildup on one or more surfaces within a processing chamber are provided herein. In embodiments disclosed herein, a processing chamber includes a chamber body having a chamber base, one or more sidewalls, and a chamber lid defining a processing volume; a showerhead disposed in the chamber lid and having a bottom surface adjacent the processing volume; and an isolator disposed between the chamber lid and the one or more sidewalls. The isolator includes a first end contacting the showerhead; a second end opposite the first end; an angled inner wall connected to the first end and extending radially outwardly from the first end towards the second end; and a lower inner wall at a different angle from the angled inner wall. The first end and the angled inner wall of the isolator form a first angle less than 90°.

20 Claims, 3 Drawing Sheets

(51) Int. Cl.
    *C23C 16/455*        (2006.01)
    *C23C 16/458*        (2006.01)
    *C23C 16/505*            (2006.01)

(52) U.S. Cl.
    CPC ...... *C23C 16/4583* (2013.01); *H01J 37/3244*
        (2013.01); *C23C 16/505* (2013.01); *H01J*
        *2237/3321* (2013.01)

(58) Field of Classification Search
    USPC ........................ 118/715; 156/345.33, 345.34
    See application file for complete search history.

(56)                References Cited

U.S. PATENT DOCUMENTS

| 6,106,625 | A | | 8/2000 | Koai et al. | |
|---|---|---|---|---|---|
| 6,159,299 | A | * | 12/2000 | Koai | H01L 21/67017 |
| | | | | | 118/728 |
| 2003/0172872 | A1 | * | 9/2003 | Thakur | C23C 16/45582 |
| | | | | | 118/715 |

| 2009/0084317 | A1 | | 4/2009 | Wu et al. | |
|---|---|---|---|---|---|
| 2011/0294303 | A1 | | 12/2011 | Sankarakrishnan et al. | |
| 2015/0380223 | A1 | | 12/2015 | Scheible et al. | |
| 2016/0181088 | A1 | * | 6/2016 | Ghosh | C23C 16/4401 |
| | | | | | 438/778 |
| 2016/0312359 | A1 | | 10/2016 | Dubois et al. | |
| 2018/0261453 | A1 | | 9/2018 | Ghosh et al. | |

FOREIGN PATENT DOCUMENTS

| JP | 2001-501379 | A | 1/2001 |
|---|---|---|---|
| JP | 2001-525495 | A | 12/2001 |
| WO | 2003/104524 | A1 | 12/2003 |
| WO | 2021-003005 | A1 | 1/2021 |

OTHER PUBLICATIONS

TW Office Action dated May 26, 2025 for Application No. 111111811.
Office Action Dtd Aug. 23, 2025 for CN 202280014221.7.
Notice of Reasons issued to Japanese Application No. 2023-562486
on Jan. 13, 2026 in 9 pages.

* cited by examiner

ISOLATOR FOR PROCESSING CHAMBERS

BACKGROUND

Field

Embodiments described herein generally relate to the field of semiconductor device manufacturing, and more particularly, to an isolator for chemical vapor deposition (CVD) chambers with improved flow.

Description of the Related Art

Deposition processes, such as chemical vapor deposition (CVD) and plasma enhanced CVD (PECVD) processes, are commonly used in semiconductor device manufacturing to deposit material layers on a substrate surface by reacting one or more gaseous precursors, or activated species thereof, with or on the substrate surface. Gaseous precursors typically include one or both of gas-phase precursors and vapor-phase precursors.

Unfortunately, gaseous precursors, and the reaction byproducts thereof, also undesirably deposit material, herein residue material, on surfaces of the walls and other components disposed in the processing volume of the processing chamber. Typically, with every substrate processed the thickness of the residue material deposits increases. Thick residue material deposits will eventually flake from the processing chamber surfaces leading to undesirable particulate contamination in the processing volume, which negatively affects the quality of the material layer deposited on the substrate. Therefore, CVD and PECVD processing chambers should be periodically cleaned to remove residue material therefrom. Typically, chamber cleaning includes one or both of periodic cleaning cycles between substrate processing operations and opening the chamber for cleaning and scheduled maintenance, both of which result in lower substrate throughput and increased chamber downtime (time unavailable for substrate processing) and, therefore, lost production capacity of the processing chamber.

Accordingly, there is a need in the art for apparatus and methods to prevent undesirable deposition of unreacted precursors and the reaction byproducts thereof on surfaces in the processing volume of a processing chamber.

SUMMARY

Embodiments disclosed herein generally relate to an isolator for chemical vapor deposition (CVD) chambers which improves the flow of processing gases, and more particularly, to an isolator which reduces low-flow of processing gases proximate the showerhead, as well as reducing undesirable residue material deposition on the showerhead.

In at least one embodiment, a processing chamber includes a chamber body having a chamber base, one or more sidewalls, and a chamber lid defining a processing volume; a showerhead disposed in the chamber lid and having a bottom surface adjacent the processing volume; and an isolator disposed between the chamber lid and the one or more sidewalls. The isolator includes a first end contacting the showerhead; a second end opposite the first end; and an angled inner wall connected to the first end and extending radially outwardly from the first end towards the second end. The first end and the angled inner wall of the isolator form a first angle less than 90°. The isolator includes a lower inner wall connected to the angled inner wall and extending towards the second end at a different angle from the angled inner wall.

In at least one embodiment, a processing chamber includes a chamber body having a chamber base, one or more sidewalls, and a chamber lid defining a processing volume. The processing chamber includes a showerhead disposed in the chamber lid and having a bottom surface adjacent the processing volume, a substrate support disposed in the processing volume, and an isolator disposed between the chamber lid and the one or more sidewalls. The isolator includes a first end contacting the showerhead, a second end opposite the first end, an angled inner wall connected to the first end and extending radially outwardly from the first end towards the second end, a conical inner wall connected to the second end and extending radially inwardly from the second end towards the first end, and a flat inner wall connecting the angled inner wall to the conical inner wall.

In at least one embodiment, an isolator for a processing chamber includes a ring-shaped body. The ring-shaped body has a first end; a second end opposite the first end; an angled inner wall connected to the first end and extending radially outwardly from the first end towards the second end; a conical inner wall connected to the second end and extending radially inwardly from the second end towards the first end; and a flat inner wall connecting the angled inner wall to the conical inner wall.

In at least one embodiment, a processing chamber includes a chamber body having a chamber base, one or more sidewalls, and a chamber lid defining a processing volume and a showerhead disposed in the chamber lid. The showerhead includes a bottom surface adjacent the processing volume; a plurality of openings disposed through the bottom surface; and a flat, unperforated, area radially outwardly surrounding the plurality of openings. The processing chamber includes an isolator disposed between the chamber lid and the one or more sidewalls. A radial width of the flat area measured inside an inner radial edge of the isolator is less than about 7/16 inches.

BRIEF DESCRIPTION OF THE DRAWINGS

So that the manner in which the above recited features of the present disclosure can be understood in detail, a more particular description of the subject matter, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein provide apparatus, and methods related thereto, for reducing undesirable residue material deposition and buildup on one or more surfaces within a processing chamber, for example during chemical vapor deposition (CVD) or plasma enhanced chemical vapor deposition (PECVD) processes. Embodiments herein further provide improved productivity using the processing chamber.

During CVD and PECVD processes, processing gases are removed from a portion of a processing volume, herein a first volume, located between a substrate support and a showerhead, through an exhaust channel circumferentially disposed in a chamber wall. The exhaust channel draws processing gases radially outward from a center region of the first volume, where the center region is above the center of the substrate. The processing gases are then removed from the exhaust channel through an exhaust port circumferentially, or substantially circumferentially, formed through the chamber wall and fluidly coupled to a vacuum source, such as one or more dedicated vacuum pumps.

During conventional CVD and PECVD processes, undesirable residue material deposition and buildup occurs on a flat area formed on a non-active perimeter portion of a bottom surface of the showerhead without openings (i.e., unperforated area) and which is exposed within the processing volume as processing gases flow from the first volume to the exhaust channel.

At least some of the processing gases flowing along the flat area of the showerhead exhibit one or both of undesirably low-flow (e.g., zero flow) or recirculation proximate the flat area which results in the undesirable residue material deposition and buildup. Residue material deposition and buildup on the flat area increases the potential for flakes and other residue particles falling from the flat area and landing on a surface of the substrate which increases defect formation on processed substrates.

One method of preventing processing gases from depositing on the flat area is to increase the temperature in the processing chamber. However, in a conventional processing chamber, temperature is limited by other factors such as maximum allowable temperature of sealing elements and film properties desired on the substrate.

Therefore, in embodiments disclosed herein, an isolator surrounding the flat area of the showerhead has a design which improves the flow of processing gases across the flat area and reduces undesirable residue material deposition and buildup thereon. Therefore, benefits of embodiments herein include reduced deposition of residue material on the showerhead, fewer required clean cycles, more time between scheduled maintenance, increased production capacity, improved yield, and reduction in defect formation on processed substrates.

Figure 1A:
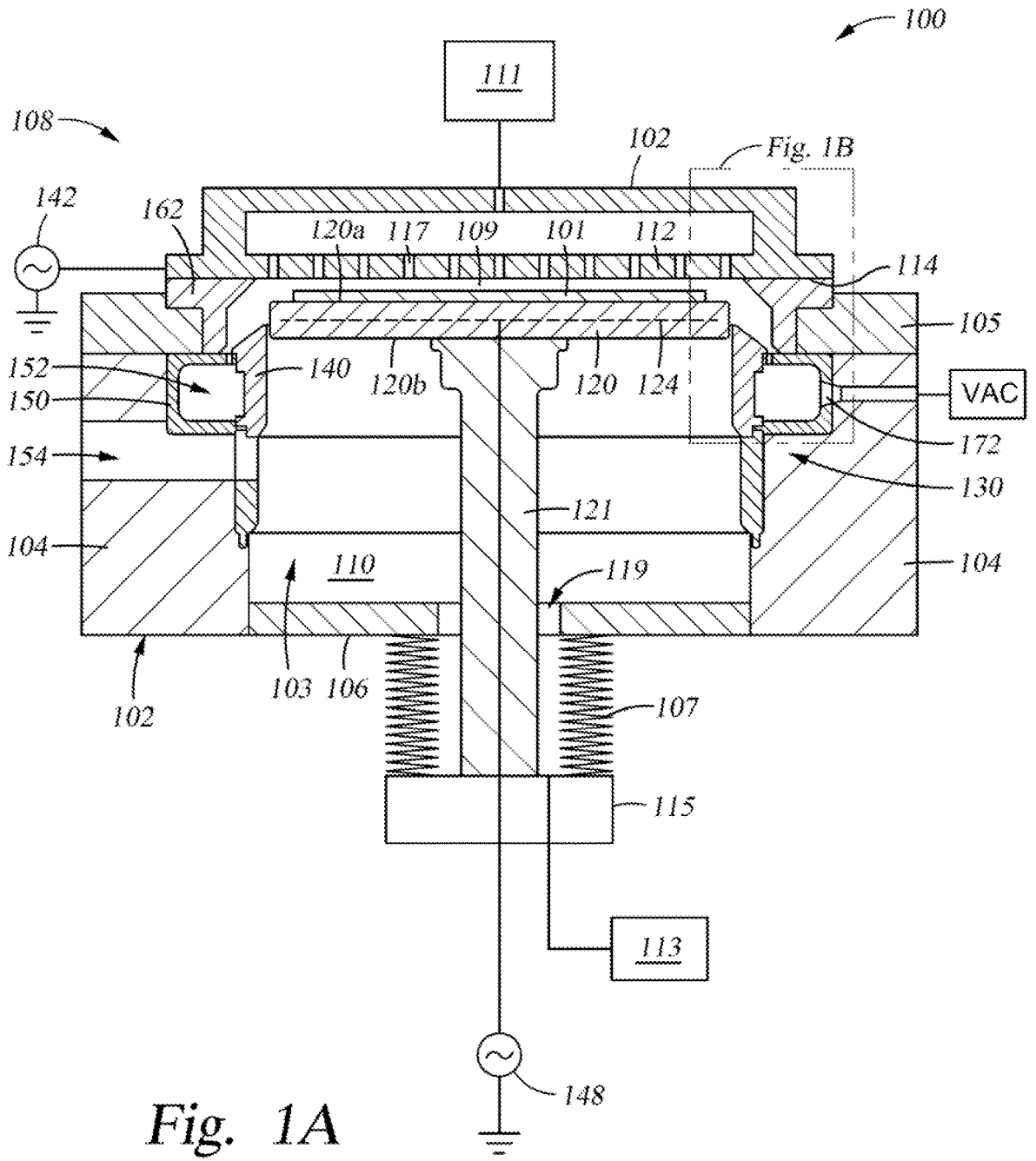
FIG. 1A is a schematic sectional view of an exemplary processing chamber, according to at least one embodiment.

FIG. 1A is a schematic sectional view of an exemplary processing chamber 100. The processing chamber 100 may be a CVD chamber, a PECVD chamber, an atomic layer deposition (ALD) chamber, or an etching chamber, among other types of vacuum chambers. The processing chamber 100 includes a chamber body 102 having one or more sidewalls 104, a chamber base 106, and a chamber lid assembly 108 which together define a processing volume 103, and a substrate support 120 disposed in the processing volume 103. The processing volume 103 includes a first volume 109 and a second volume 110. The first volume 109 is defined by the inner surface of the sidewalls 104, the inner surface of the chamber lid assembly 108 and the chamber lid assembly facing surface(s) of the substrate support 120, such as the first surface 120a, when the substrate support 120 is in a raised, substrate processing, position (as shown). The second volume is defined by the inner surface of the one or more sidewalls 104, the chamber base facing surface(s) of the substrate support 120, such as the second surface 120b, when the substrate support is in the raised, substrate processing, position and the inner surface of the chamber base 106. Typically, the first volume 109 is less than about 10% of the processing volume 103, such as less than about 5% thereof.

The chamber lid assembly 108 is electrically isolated from the one or more sidewalls 104 by an annular isolator 162 disposed therebetween. The isolator 162 is formed from an electrically insulating material. For example, the isolator 162 may be formed from a ceramic material, such as aluminum oxide (e.g., $Al_2O_3$). A showerhead 112, disposed in the chamber lid assembly 108 and coupled thereto, has a plurality of openings 117 disposed therethrough, which uniformly distribute one or more gaseous precursors from a precursor source 111 into the first volume 109. The plurality of openings 117 may be circumferentially aligned into one or more concentric annular rings. The showerhead 112 may include one or more of a faceplate, blocking plate, and other intermittent diffuser plates.

Herein, the showerhead 112 is formed of an electrically conductive material, for example aluminum, and is coupled to a first power supply 142, such as an RF power supply, which supplies power to ignite and maintain a plasma of the gaseous precursors through capacitive coupling therewith. At least one of DC power or pulsed DC power, of positive or negative polarity, and of pulsed RF power may also be coupled to the showerhead 112.

Figure 1B:
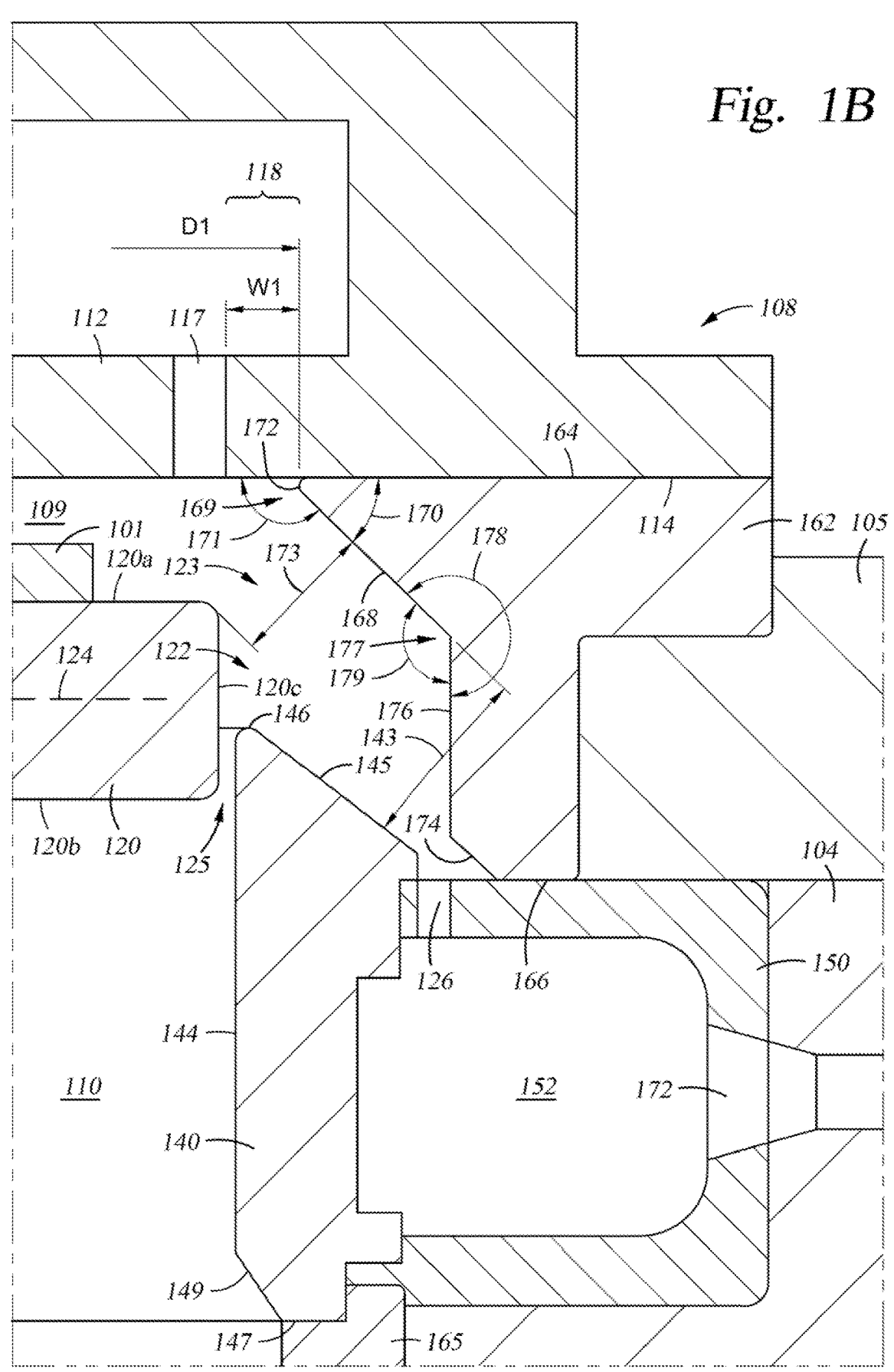
FIG. 1B is a close up view of a portion of FIG. 1A.

A bottom surface 114 of the showerhead 112 is adjacent the processing volume 103. In one example, the showerhead 112 includes a faceplate, and the bottom surface 114 of the showerhead 112 corresponds to a lower surface of the faceplate facing the processing volume 103. The bottom surface 114 of the showerhead 112 has a flat area 118 radially outwardly surrounding the plurality of openings 117. The flat area 118 is unperforated. The flat area 118 is formed on a non-active perimeter portion of the bottom surface 114 of the showerhead 112 without openings and which is exposed within the processing volume 103. For example, an inner diameter of the flat area 118 may be defined radially outside outermost ones of the plurality of openings 117 (e.g., outside an outermost one of the one or more concentric rings). An outer diameter of the flat area 118 may be defined radially inside the isolator 162 (e.g., inside an inner radial edge 172 of the isolator 162 as shown in FIG. 1B). The flat area 118 is described in more detail below with respect to FIGS. 1B and 2.

Figure 2:
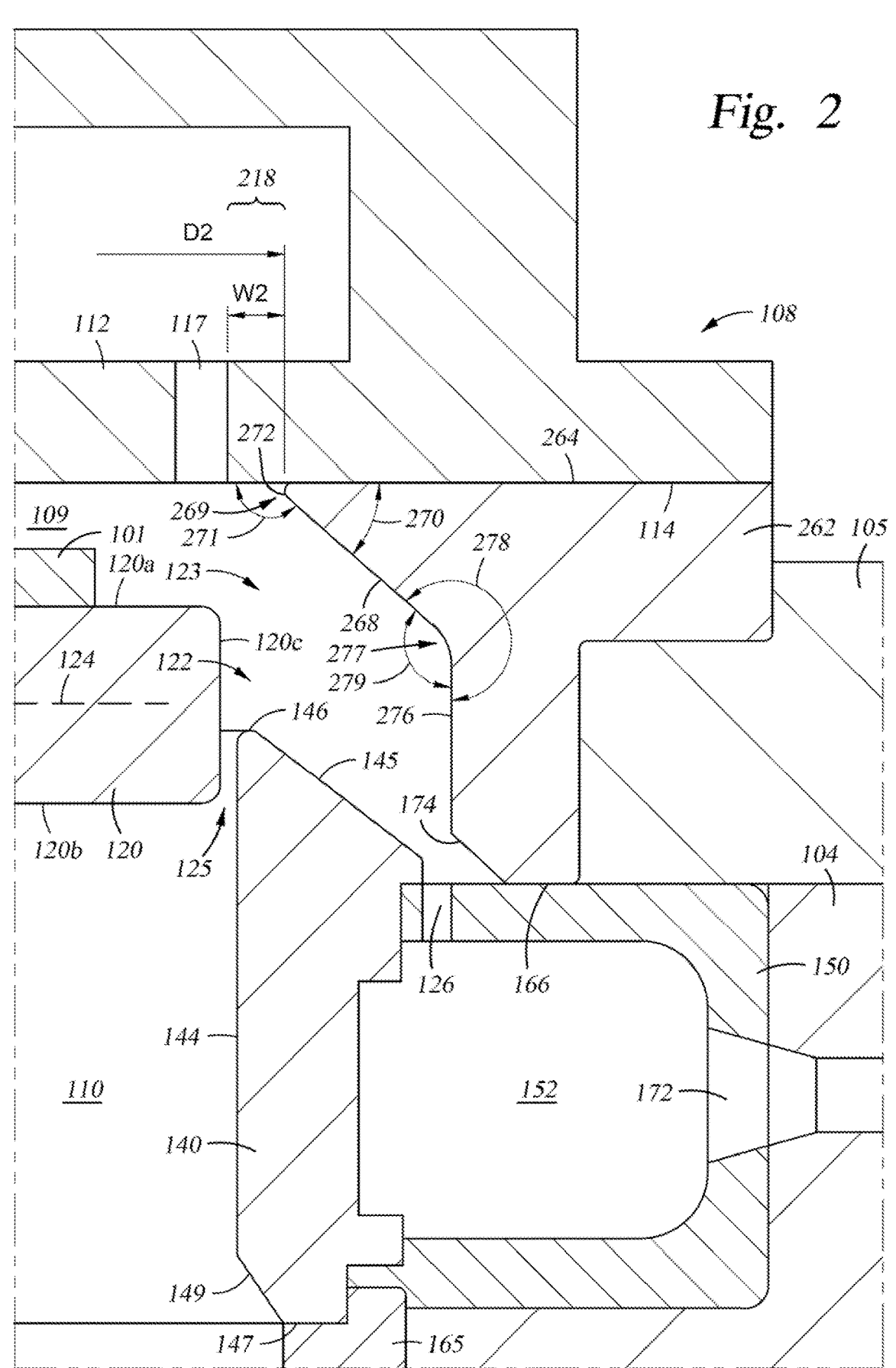
FIG. 2 is an enlarged partial sectional view of FIG. 1A illustrating another exemplary isolator installed in the processing chamber, according to at least one embodiment.

The substrate support 120 includes the first surface 120a facing the chamber lid assembly 108 for receiving a substrate 101, the second surface 120b opposite the first surface 120a and facing the chamber base 106, and a circumferential third surface 120c, shown in FIGS. 1B and 2, connecting the first surface 120a and the second surface 120b. The third surface 120c faces the one or more sidewalls 104 and is orthogonal to the first and second surfaces 120a, 120b. The first surface 120a has a first plane and the second surface 120b has a second plane substantially in parallel with the first plane. As used herein, the term "substantially parallel" at least means that the first plane and the second plane will not intersect within the processing volume 103 of the processing chamber 100.

Typically, during processing to form a thin film thereon, a substrate 101 is secured to the first surface 120a of the substrate support 120 by an electrostatic chucking (ESC) force. The chucking force is a function of a potential between a voltage provided to a chucking electrode 124 embedded in a dielectric material of the substrate support 120 and the substrate 101 disposed thereon. Typically, the chucking electrode 124 is coupled to a second power supply 148, such as a DC power supply. The substrate support 120 may include one or more heaters (not shown), such as one or more resistive heating elements, embedded therein. The substrate support 120 may include one or more cooling channels (not shown) disposed therein that are fluidly coupled to, and in fluid communication with, a coolant source (not shown) through one or more coolant lines (not shown). Typically, the coolant source is a refrigerant source or water source having a relatively high electrical resistance. In one example, the substrate support 120 includes both of one or more heaters and one or more cooling channels to enable fine control of the temperature of the substrate support 120 and the substrate 101 disposed thereon.

The substrate support 120 is coupled to a support shaft 121 which is coupled to a lift actuator 115 which raises and lowers the support shaft 121, and the substrate support 120 coupled thereto, to facilitate processing of the substrate 101 and transfer thereof to and from the processing chamber 100. A bellows 107, circumscribing the support shaft 121, is coupled to the chamber base 106 and to the lift actuator 115 to provide a flexible seal therebetween and to maintain the vacuum integrity of the processing volume 103. The lift actuator 115 is configured to move the substrate support 120 between a lowered position (not shown), to facilitate transfer of the substrate 101 to and from the processing volume 103 and a raised position, as shown, for processing of the substrate 101.

The substrate 101 is loaded into, and removed from, the processing volume 103 through an opening 154 in one of the one or more sidewalls 104, which is conventionally sealed with a door or a valve (not shown) during substrate processing. Typically, the processing chamber 100 further includes a conventional lift pin system (not shown) used to lift the substrate 101 from the substrate support 120 when the substrate support 120 is in a lowered position (not shown) which enables access to the substrate 101 by a robot handler (not shown).

A purge gas may be delivered to the second volume 110 during substrate processing or chamber cleaning operations. The purge gas flows into the second volume 110 through one or more openings 119 disposed through the chamber base 106 around the support shaft 121 or at one or more locations radially outward therefrom. The one or more openings 119 have a symmetrical cross sectional shape, such as a circular cross sectional shape. In another example, the one or more openings 119 have an asymmetrical cross sectional shape. The purge gas is provided by a purge gas source 113 in fluid communication with the one or more openings 119. The purge gas may include one or both of an inert gas, such as $N_2$, Ar, Ne, Kr, or a combination thereof, and an oxygen containing gas, such as $O_2$, $N_2O$, $CO_2$, or a combination thereof.

An exhaust liner assembly 130, disposed in the processing volume 103, is configured to reduce undesirable residue material deposition on the inner walls of the chamber body 102 and on surfaces of chamber components disposed in the second volume 110, by facilitating the uniform removal of processing gases from the first volume 109, and to prevent purge gas from flowing into the first volume 109 from the second volume 110. The exhaust liner assembly 130 includes a circumferential, C-channel shaped in section, liner 150, hereafter C-shaped liner 150, a circumferential isolator 162, and a circumferential top liner 140 which define flow pathways of the processing gases and the purge gas during substrate processing, as described in more detail below. The processing chamber 100 may include a circumferential bottom liner 165, disposed between the top liner 140 and the chamber base 106, which lines at least a portion of the surface of the one or more sidewalls 104 facing the processing volume 103.

Herein, the isolator 162 and respective liners 140, 150, and 165 are made from a ceramic material, such as aluminum oxide, or other material which is suitably resistant to heat and corrosion from halogen containing cleaning plasmas, such as $NF_3$ based plasma. The isolator 162 and liners 140 and 150 may be periodically removed from the processing chamber 100 for scheduled cleaning or replacement.

Herein, the C-channel liner 150 is disposed in a circumferential channel located below the substrate support 120 and radially outwardly therefrom. The circumferential channel is defined by the isolator 162, one or more sidewalls 104, and a top plate 105 secured to the one or more sidewalls 104. The top plate 105 is located adjacent to the isolator 162 and disposed radially outwardly therefrom. The circumferential channel and the C-channel liner 150 disposed therein, are located below the second plane of the substrate support 120 when the substrate support 120 is in a raised, substrate processing, position (as shown).

FIG. 1B is a close up view of a portion of FIG. 1A. A portion of the isolator 162 extends radially inwardly of the one or more sidewalls 104, at a location between the C-channel liner 150 and the chamber lid assembly 108 and along the inner surface of the chamber lid assembly 108, and terminates radially outwardly from, but proximate, to the substrate support 120 when the substrate support 120 is in the raised, substrate processing position. The top liner 140 is disposed radially inwardly of the C-channel liner 150. Surfaces of the top liner 140 and the C-channel liner 150 define an exhaust channel 152 which is in fluid communication with a vacuum source, such as one or more dedicated vacuum pumps, through an exhaust port 172 formed through the C-channel liner 150 and further through one of the one or more sidewalls 104.

The isolator 162 is a ring-shaped body having a first end 164 contacting the bottom surface 114 of the showerhead 112. A second end 166 of the isolator 162 opposite the first end 164 is disposed on the C-channel liner 150. An angled inner wall 168 of the isolator 162 is connected to the first end 164 and extends radially outwardly from the first end 164 towards the second end 166. The first end 164 and the angled inner wall 168 of the isolator 162 form an angle 170. The angle 170 is less than 90°, such as about 60° or less, such as about 45° degrees or less, such as about 0° to about 90°, such as about 30° to about 45°, such as about 35°, such as about 40°, in order to improve flow of processing gases across the flat area 118 and to reduce undesirable residue material deposition on the flat area 118. For example, when the angle 170 is less than 90°, the occurrence of low-flow and recirculation of processing gases in the flat area 118 is reduced.

A shape 169 of the processing volume 103 defined by the bottom surface 114 of the showerhead 112 and the angled inner wall 168 of the isolator 162 forms an angle 171. It will be appreciated that in the illustrated embodiments, the angle 171 is dependent on the angle 170 of the isolator 162. The angle 171 is greater than 90°, such as about 135° or greater, such as about 90° to about 180°, such as about 135° to about 150°, such as about 140°, such as about 145°, in order to improve flow of processing gases across the flat area 118 and to reduce undesirable residue material deposition on the flat area 118 as described above. For example, the angle 170 and shape 169 of the processing volume 103 may ensure laminar flow of processing gases along the flat area 118.

The angled inner wall 168 is connected to the first end 164 at an inner radial edge 172 of the isolator 162. An inner diameter D1 of the isolator 162 measured inside the inner radial edge 172 is about 13⅜ inches to about 13½ inches, such as about 13⁷⁄₁₆ inches. A radial width W1 of the flat area 118 measured inside the inner radial edge 172 of the isolator 162 and outside outermost ones of the plurality of openings 117 (e.g., outside an outermost one of the one or more concentric rings) is about ⁷⁄₁₆ inches to about ½ inch, such as about 0.46 inches. A ratio of the flat area 118 to a remaining area of the bottom surface 114 of the showerhead 112 inside the flat area 118 is about 12% to about 15%, such as about 14.5%.

A conical inner wall 174 of the isolator 162 is connected to the second end 166 and extends radially inwardly from the second end 166 towards the first end 164. A lower inner wall 176 of the isolator 162 connects the angled inner wall 168 to the conical inner wall 174. The lower inner wall 176 extends towards the second end 166 at a different angle from the angled inner wall 168. The lower inner wall 176 may be substantially flat in relation to the angled inner wall 168 (e.g., having a substantially vertical orientation in contrast to the non-vertical orientation of the angled inner wall 168). The angled inner wall 168 and the lower inner wall 176 of the isolator 162 form an angle 178. The angle 178 is less than 270°, such as about 240° or less, such as about 225° to about 240°, such as about 230°, such as about 235°. A shape 177 of the processing volume 103 defined by the angled inner wall 168 and the lower inner wall 176 of the isolator 162 forms an angle 179. It will be appreciated that in the illustrated embodiments, the angle 179 is dependent on the angle 178 of the isolator 162. The angle 179 is greater than 90°, such as about 120° or greater, such as about 90° to about 180°, such as about 120° to about 135°, such as about 125°, such as about 130°. A radius of curvature of the shape 177 may be about 0.3 inches or less, such as about 0.05 inches to about 0.2 inches, such as about 0.1 inches.

The top liner 140 is disposed between the first end 164 of the isolator 162 and the chamber base 106. The top liner 140 is disposed radially inwardly of the one or more sidewalls 104 and the C-channel liner 150. The top liner 140 includes at least an inner wall 144, an angled outer wall 145, a first end 146 connecting the inner wall 144 to the angled outer wall 145, and a second end 147 (shown in FIG. 1A) opposite the first end 146. The top liner 140 may include a conical inner wall 149 (shown in FIG. 1A) connecting the second end 147 to the inner wall 144. The conical inner wall 149 extends radially outward from the inner wall 144 towards the second end 147. When disposed in the processing chamber 100, the inner wall 144 is substantially in parallel with the third surface 120c of the substrate support 120 about the outer circumference thereof. The second end 147 may rest on a surface of the bottom liner 165 when the top liner 140 is disposed in the processing chamber 100.

A first plane of the angled inner wall 168 of the isolator 162 and a second plane of the angled outer wall 145 of the top liner 140 define an angle 143 therebetween. The angle 143 is about 30° or less, such as about 10° or less. In one example, the first and second planes are substantially parallel (e.g., within +/−10 degrees, such as +/−5 degrees, such as +/−3 degrees, such as +/−1 degree. One advantage of isolator 162 is that the angle 143 is provides unrestricted flow of processing gases between the angled inner wall 168 of the isolator 162 and the angled outer wall 145 of the top liner 140.

The third surface 120c of the substrate support 120 (in the raised position), the top liner 140, and the isolator 162 define a combined gas exhaust volume 122 having a first inlet 123 and a second inlet 125. The first inlet 123 is located between the angled inner wall 168 of the isolator 162 and the third surface 120c of the substrate support 120. The second inlet 125 is located between the inner wall 144 of the top liner 140 and the third surface 120c of the substrate support 120.

An opening of the first inlet 123 into the combined gas exhaust volume 122 is located above the first plane of the first surface 120a so that flow of processing gas along the flat area 118 is unrestricted. A minimum distance, e.g., distance 173, between the angled inner wall 168 and the third surface 120c of the substrate support 120 (which corresponds to the first inlet 123) is greater than about 0.2 inches, such as about 0.25 inches to about 0.4 inches, such as about ⅜ inches. One advantage of isolator 162 is that the first inlet 123 has an increased flow area compared to conventional apparatus in which the minimum distance is typically less than 0.2 inches which restricts flow of processing gases. Isolator embodiments disclosed herein having increased flow area through the first inlet 123 reduce undesirable residue material deposition on the flat area 118 with consequent reduction in defect formation on substrates processed in the processing chamber 100.

An opening of the second inlet 125 into the combined gas exhaust volume 122 is located above the second plane of the second surface 120b so that purge gas is drawn into the combined gas exhaust volume 122 and blocks processing gas from flowing into the second volume 110. An outlet 126 from the combined gas exhaust volume 122 into the exhaust channel 152 is defined by a circumferential wall at an inner terminus of an arm of the C-channel liner 150 and a sidewall facing surface of the top liner 140.

During substrate processing, processing gas from the first volume 109 flows radially outwardly from a region above the substrate 101 and flows directly into the combined gas exhaust volume 122, in contrast to conventional apparatus in which processing gas is forced to flow through a restricted area around the third surface 120c of the substrate support 120. Simultaneously, purge gas in the second volume 110 is drawn into the combined gas exhaust volume 122 through the second inlet 125. Both the processing gas and purge gas are then drawn from the combined gas exhaust volume 122 through the outlet 126 and into the exhaust channel 152 where the gases are evacuated from the processing chamber 100 through the exhaust port 172. The angled outer wall 145 of the top liner 140, facing the combined gas exhaust volume 122, directs processing gas flowing through the first inlet 123 away from the second inlet 125 to prevent the processing gas from undesirably entering the second volume 110.

FIG. 2 is an enlarged partial sectional view of FIG. 1A illustrating another exemplary isolator 262 installed in the processing chamber 100. The isolator 262 has a different shape compared to the isolator 162. In particular, surfaces of the isolator 262 disposed adjacent the processing volume 103 have a different profile which can further improve flow of processing gases in flat area 218 and reduce residue material deposition thereon. Compared to the isolator 162, a first end 264 of the isolator 262 is wider in the radial direction compared to the first end 164 and an inner diameter D2 of inner radial edge 272 is less than the inner diameter D1. The inner diameter D2 of the isolator 262 measured inside the inner radial edge 272 is less than about 13⅜ inches, such as about 13 inches to about 13¼ inches, such as about 13⅛ inches. As a result, a radial width W2 of the flat area 218 is less than the radial width W1 of the flat area 118. The radial width W2 of the flat area 218 measured inside the inner radial edge 272 of the isolator 262 and outside outermost ones of the plurality of openings 117 (e.g., outside an outermost one of the one or more concentric rings) is less than about 7/16 inches, such as about ¼ inch to about 7/16 inches, such as about ¼ inch to about 5/16 inches, such as about 5/16 inches. The isolator 262 covers more of the flat area 218 than conventional apparatus which provides less area for undesirable residue material deposition and buildup with consequent reduction in defect formation on substrates processed in the processing chamber 100.

As illustrated in FIG. 2, the inner radial edge 272 of the isolator 262 is substantially aligned with the inner wall 144 of the top liner 140. In another example (not shown), the inner radial edge 272 of the isolator 262 is disposed radially inwardly of the inner wall 144 of the top liner 140. A ratio of the flat area 218 to a remaining area of the bottom surface 114 of the showerhead 112 inside the flat area 218 is less than about 10%, such as about 8% to about 10%, such as about 9% to about 10%, such as about 9.5%.

As illustrated in FIG. 2, a first end 264 and angled inner wall 268 of the isolator 262 form an angle 270 which is less than the angle 170. As a result, a shape 269 of the processing volume 103 defined by the bottom surface 114 of the showerhead 112 and the angled inner wall 268 of the isolator 262 forms a wider angle 271 which further improves flow of processing gases across the flat area 218.

Compared to the isolator 162, the angled inner wall 268 and lower inner wall 276 of the isolator 262 form an angle 278 which is greater than the angle 178. Also, a shape 277 of the processing volume 103 defined by the angled inner wall 268 and the lower inner wall 276 of the isolator 262 forms an angle 279 which is less than the angle 179. A radius of curvature of the shape 277 is greater than the corresponding shape 177. For example, the radius of curvature of the shape 277 may be about 0.3 inches or greater, such as about 0.4 inches to about 0.6 inches, such as about 0.5 inches.

A substrate processing method may include respectively flowing one or more gaseous precursors into the first volume; forming a plasma of the one or more gaseous precursors; exposing the substrate to the plasma; and depositing a material layer on the substrate. The method may include simultaneously (with depositing the material layer) evacuating a processing gas comprising one or both of unreacted gaseous precursor or gaseous precursor reaction byproducts and the purge gas from the processing volume through a combined gas exhaust volume at least partially disposed between the first plane of the first surface and the second plane of the second surface.

The plasma may be formed by capacitive coupling with the one or more gaseous precursors, where a power provided to the showerhead disposed in the chamber lid, or to a faceplate of the showerhead, is between about 100 W and about 3000 W. In another example, the processing chamber comprises an inductive plasma generator and the plasma is formed through inductive coupling with the one or more gaseous precursors.

The one or more gaseous precursors may comprise a silicon-containing precursor, such as silane, dimethylsilane, trimethylsilane, tetramethylsilane, diethylsilane, tetramethylorthosilicate (TMOS), tetraethylorthosilicate (TEOS), octamethyltetrasiloxane (OMTS), octamethylcyclotetrasiloxane (OMCTS), tetramethylcyclotetrasiloxane (TOMCATS), or a mixture thereof. The one or more gaseous precursors may comprise a mixture of a silicon-containing precursor and one or both of an oxygen containing precursor, such as oxygen ($O_2$), ozone ($O_3$), NO, $NO_2$, or a mixture thereof, and a hydroxyl-containing precursor such as $H_2O$, hydrogen peroxide, or mixtures thereof. The one or more gaseous precursors may be combined with a carrier gas such as He, $N_2$, Ar or a combination thereof before flowing into the processing volume.

In one example, the deposited material layer comprises silicon oxide (e.g., $SiO_2$), the gaseous precursor comprises TEOS, and a purge gas introduced into the second volume through one or more openings in the chamber base comprises 02. Typically, the TEOS precursor flowrate is between about 5 grams per minute (gm/min) and about 30 gm/min, such as about 5 gm/min and about 25 gm/min. The processing volume is typically maintained at a pressure between about 10 mTorr and about 20 Torr, such as between about 1 Torr and about 10 Torr. The substrate is maintained at a temperature between about 350° C. and about 550° C., such as between about 400° C. and about 500° C., for example about 425° C. The temperature of the faceplate is maintained between about 100° C. and about 300° C. An Ar carrier gas flowrate is between about 1 slm and about 20 slm, such as between about 5 slm and about 15 slm. The $O_2$ purge gas flowrate is between about 1 slm and about 20 slm, such as between about 1 slm and about 10 slm, such as about 5 slm. A spacing between the first surface of the substrate support and the showerhead is between about 150 mil and about 300 mil, such as about 200 mil and about 250 mil. The above values are for a processing chamber sized to process a 300 mm substrate. Appropriate scaling may be used for processing chambers sized for other substrates.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber, comprising:
   a chamber body having a chamber base, one or more sidewalls, and a chamber lid defining a processing volume;
   a showerhead disposed in the chamber lid and having a bottom surface adjacent the processing volume; and
   an isolator disposed between the chamber lid and the one or more sidewalls, the isolator comprising:
   a first end contacting the showerhead;
   a second end opposite and parallel to the first end;
   an angled inner wall adjoined to the first end and extending radially outwardly from the first end towards the second end, wherein the first end and the angled inner wall of the isolator form a first angle less than 90°; and
   a lower inner wall connected to the angled inner wall and extending towards the second end at a different angle from the angled inner wall.

2. The processing chamber of claim 1, wherein the first angle is about 30° to about 45°.

3. The processing chamber of claim 1, wherein the bottom surface of the showerhead and the angled inner wall of the isolator form a second angle greater than 90°.

4. The processing chamber of claim 1, wherein the second angle is about 135° to about 150°.

5. The processing chamber of claim 1, wherein the angled inner wall is connected to the first end at an inner radial edge of the isolator.

6. The processing chamber of claim 5, wherein a radial width of a flat, unperforated, area of the showerhead measured inside the inner radial edge of the isolator is less than about 7/16 inches.

7. The processing chamber of claim 5, wherein an inner diameter of the isolator measured inside the inner radial edge is less than about 13⅜ inches.

8. The processing chamber of claim 5, further comprising:
a liner disposed between the first end of the isolator and the chamber base and disposed radially inwardly of the one or more sidewalls, the liner comprising:
an inner wall;
an angled outer wall; and
a first end connecting the inner wall to the angled outer wall; and
a second end opposite the first end;
wherein the inner radial edge of the isolator is substantially aligned with or disposed radially inwardly of the inner wall of the liner.

9. The processing chamber of claim 1, further comprising a substrate support, wherein the substrate support comprises:
a first surface;
a second surface opposite the first surface; and
a third surface connecting the first surface and the second surface around a circumference of the substrate support;
wherein a minimum distance between the angled inner wall and the third surface of the substrate support is greater than about 0.2 inches.

10. The processing chamber of claim 1, further comprising a liner disposed between the first end of the isolator and the chamber base and disposed radially inwardly of the one or more sidewalls, the liner comprising:
an inner wall;
an angled outer wall;
a first end connecting the inner wall to the angled outer wall; and
a second end opposite the first end;
wherein a first plane of the angled inner wall of the isolator and a second plane of the angled outer wall of the liner form a third angle of about 30° or less.

11. The processing chamber of claim 10, wherein the third angle is about 10° or less.

12. The processing chamber of claim 10, wherein the first and second planes are substantially parallel.

13. An isolator for a processing chamber, comprising:
a ring-shaped body, the ring-shaped body having:
a first end;
a second end opposite and parallel to the first end;

an angled inner wall adjoined to the first end and extending radially outwardly from the first end towards the second end;
a conical inner wall connected to the second end and extending radially inwardly from the second end towards the first end; and
a flat inner wall connecting the angled inner wall to the conical inner wall.

14. The processing chamber of claim 13, wherein the first end and the angled inner wall of the isolator form a first angle less than 90°.

15. The processing chamber of claim 14, wherein the first angle is about 30° to about 45°.

16. The processing chamber of claim 13, wherein the angled inner wall and the flat inner wall of the isolator form a second angle less than 270°.

17. The processing chamber of claim 16, wherein the second angle is about 225° to about 240°.

18. A processing chamber, comprising:
a chamber body having a chamber base, one or more sidewalls, and a chamber lid defining a processing volume;
a showerhead disposed in the chamber lid, the showerhead comprising:
a bottom surface adjacent the processing volume;
a plurality of openings disposed through the bottom surface; and
a flat, unperforated, area radially outwardly surrounding the plurality of openings; and
an isolator disposed between the chamber lid and the one or more sidewalls, the isolator comprising a first end contacting the chamber lid and a second end opposite and parallel to the first end, wherein a radial width of the flat area measured inside an inner radial edge of the isolator is less than about 7/16 inches.

19. The processing chamber of claim 18, wherein a ratio of the flat area to a remaining area of the bottom surface of the showerhead inside the flat area is less than about 10%.

20. The processing chamber of claim 18, wherein the plurality of openings are circumferentially aligned into one or more concentric rings, and wherein the radial width of the flat area is measured outside an outermost one of the one or more concentric rings.

* * * * *